(12) United States Patent
Kim

(10) Patent No.: US 11,362,145 B2
(45) Date of Patent: Jun. 14, 2022

(54) ORGANIC LIGHT EMITTING DEVICE AND METHOD OF MANUFACTURING THE SAME

(71) Applicant: SAMSUNG ELECTRONICS CO., LTD., Suwon-si (KR)

(72) Inventor: Myoungsoo Kim, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 196 days.

(21) Appl. No.: 16/782,260

(22) Filed: Feb. 5, 2020

(65) Prior Publication Data
US 2021/0050387 A1    Feb. 18, 2021

(30) Foreign Application Priority Data
Aug. 12, 2019    (KR) .......................... 10-2019-0098400

(51) Int. Cl.
*H01L 27/32*    (2006.01)
*H01L 51/52*    (2006.01)

(52) U.S. Cl.
CPC ...... *H01L 27/3206* (2013.01); *H01L 27/3248* (2013.01); *H01L 27/3258* (2013.01); *H01L 51/5265* (2013.01); *H01L 27/322* (2013.01)

(58) Field of Classification Search
CPC ............ H01L 51/5265; H01L 27/3206; H01L 27/3248; H01L 27/3258; H01L 27/322
See application file for complete search history.

(56) References Cited

U.S. PATENT DOCUMENTS

| | | |
|---|---|---|
| 6,372,608 B1 | 4/2002 | Shimoda et al. |
| 6,645,830 B2 | 11/2003 | Shimoda et al. |
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |

(Continued)

FOREIGN PATENT DOCUMENTS

KR   10-2008-0061675 A   7/2008
KR   10-1429933 B1   8/2014

*Primary Examiner* — Sue A Purvis
*Assistant Examiner* — Scott Stowe
(74) *Attorney, Agent, or Firm* — Lee IP Law, P.C.

(57) ABSTRACT

An OLED including a substrate; a circuit region; reflective metal layers on the circuit region and including first to third reflective metal layers spaced apart from each other; an insulating layer including first to third insulating regions covering upper surfaces of the reflective metal layers and having a first to third thicknesses that are different from one another; first to third via plugs penetrating through the insulating layer to contact the reflective metal layers, first electrodes in contact with the via plugs, and covering a portion of an upper surface of the insulating layer; an organic light emitting layer on the first electrodes; and a second electrode on the organic light emitting layer, wherein the first to third via plugs include tungsten.

18 Claims, 9 Drawing Sheets

(56) References Cited

U.S. PATENT DOCUMENTS

| | | |
|---|---|---|
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,812,519 B2 | 10/2010 | Chang et al. |
| 7,839,081 B2 | 11/2010 | Kubota et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,735,931 B2 | 5/2014 | Han et al. |
| 8,766,295 B2 | 7/2014 | Kim |
| 9,153,796 B2 | 10/2015 | Sato et al. |
| 9,425,435 B2 | 8/2016 | Ando et al. |
| 9,773,851 B2 | 9/2017 | Zhang et al. |
| 10,276,833 B2 | 4/2019 | Lee et al. |
| 2015/0340645 A1 | 11/2015 | Guo et al. |
| 2016/0126456 A1 | 5/2016 | Kwon et al. |
| 2016/0315131 A1 | 10/2016 | Li et al. |
| 2017/0236881 A1 | 8/2017 | Shen et al. |
| 2017/0352842 A1 | 12/2017 | Shiratori et al. |
| 2018/0062116 A1 | 3/2018 | Park et al. |
| 2018/0083226 A1 | 3/2018 | Ichikawa et al. |
| 2021/0217980 A1* | 7/2021 | Yang .................. H01L 51/504 |

\* cited by examiner

ORGANIC LIGHT EMITTING DEVICE AND METHOD OF MANUFACTURING THE SAME

CROSS-REFERENCE TO RELATED APPLICATION

Korean Patent Application No. 10-2019-0098400, filed on Aug. 12, 2019, in the Korean Intellectual Property Office, and entitled: "Organic Light Emitting Device and Method of Manufacturing the Same," is incorporated by reference herein in its entirety.

BACKGROUND

1. Field

Embodiments relate to an organic light emitting device and a method of manufacturing the same.

2. Description of the Related Art

Various flat displays such as liquid crystal displays (LCDs), field emission displays (FEDs), organic light emitting diodes (OLEDs), and the like are put to practical use. For example, microdisplays having a relatively smaller pixel size may be applied to products such as head-mounted displays (HMDs) as glasses-type monitors for virtual reality or augmented reality.

SUMMARY

The embodiments may be realized by providing an organic light emitting device including a substrate; a circuit region on the substrate, the circuit region including a circuit device; reflective metal layers on the circuit region, the reflective metal layers including a first reflective metal layer, a second reflective metal layer and a third reflective metal layer spaced apart from each other in a horizontal direction; an insulating layer including a first insulating region, a second insulating region, and a third insulating region, the first insulating region covering an upper surface of the first reflective metal layer and having a first thickness in a vertical direction orthogonal to the horizontal direction, the second insulating region covering an upper surface of the second reflective metal layer and having a second thickness in the vertical direction that is greater than the first thickness, and the third insulating region covering an upper surface of the third reflective metal layer and having a third thickness in the vertical direction that is greater than the second thickness; via plugs including a first via plug, a second via plug, and a third via plug, the first via plug penetrating through the first insulating region to contact the first reflective metal layer, the second via plug penetrating through the second insulating region to contact the second reflective metal layer, and the third via plug penetrating through the third insulating region to contact the third reflective metal layer; first electrodes in contact with the via plugs, respectively, and covering a portion of an upper surface of the insulating layer; an organic light emitting layer on the first electrodes; and a second electrode on the organic light emitting layer, wherein the first via plug, the second via plug, and the third via plug each include tungsten.

The embodiments may be realized by providing an organic light emitting device including a substrate part including a substrate, a circuit region including circuit devices on the substrate, reflective metal layers on the circuit region, an insulating layer covering side and upper surfaces of the reflective metal layers, and via plugs penetrating through the insulating layer; and a light emitting part including first electrodes covering the insulating layer and in contact with the via plugs, an organic light emitting layer on the first electrodes, and a second electrode on the organic light emitting layer, wherein the insulating layer includes portions having different thicknesses from each other, the thicknesses being in a vertical direction, and the via plugs include a first region contacting the reflective metal layers and including tungsten, and a second region on the first region.

The embodiments may be realized by providing an organic light emitting device including a substrate; a first reflective metal layer, a second reflective metal layer and a third reflective metal layer, spaced apart from each other on the substrate in a horizontal direction; an insulating layer including a first insulating region, a second insulating region, and a third insulating region, the first insulating region covering an upper surface of the first reflective metal layer and having a first thickness in a vertical direction orthogonal to the horizontal direction, the second insulating region covering an upper surface of the second reflective metal layer and having a second thickness in the vertical direction that is greater than the first thickness, and the third insulating region covering an upper surface of the third reflective metal layer and having a third thickness in the vertical direction that is greater than the second thickness; and a first via plug penetrating through the first insulating region and contacting the first reflective metal layer, a second via plug penetrating through the second insulating region and contacting the second reflective metal layer, and a third via plug penetrating through the third insulating region and contacting the third reflective metal layer, wherein the first via plug has a first height in the vertical direction from the first reflective metal layer that is less than the first thickness, the second via plug has a second height in the vertical direction from the second reflective metal layer that is less than the second thickness, and the third via plug has a third height in the vertical direction from the third reflective metal layer that is less than the third thickness.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
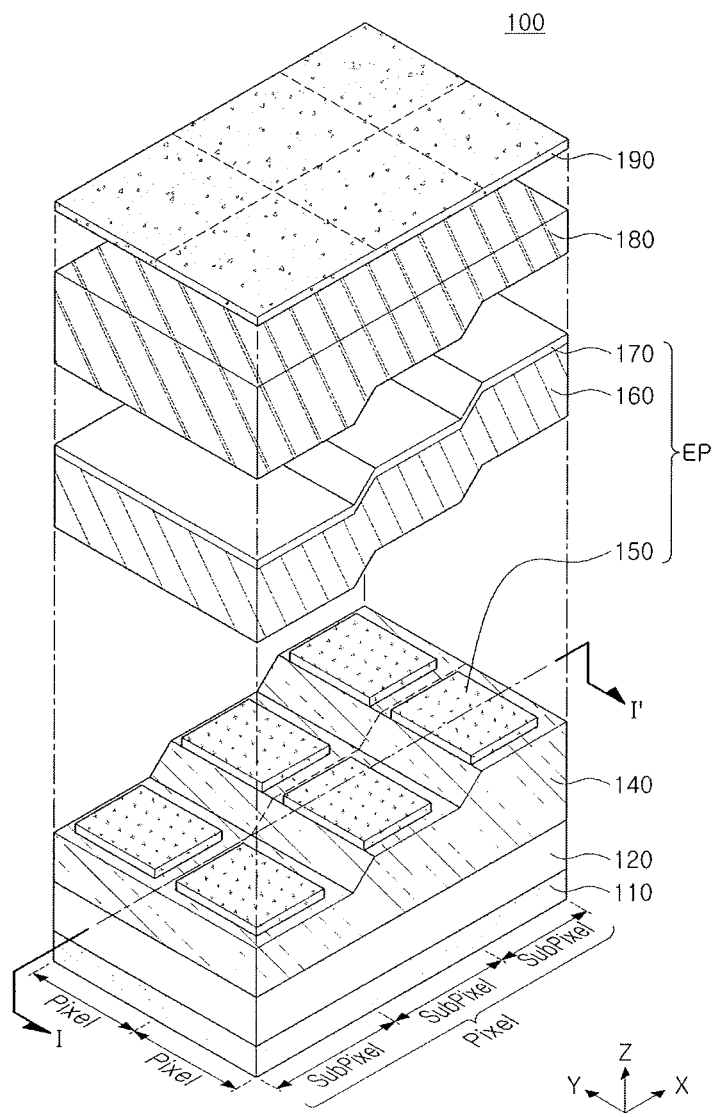
FIG. 1 illustrates a perspective view of an organic light emitting device according to example embodiments.

FIG. 1 illustrates an exploded perspective view illustrating an organic light emitting device 100 according to example embodiments.

An organic light emitting device 100 may include a substrate 110, a circuit region 120 on the substrate 110, an insulating layer 140 on the circuit region 120, first electrodes 150 on the insulating layer 140, an organic light emitting layer 160 on the first electrodes 150, a second electrode 170 on the organic light emitting layer 160, an encapsulation layer 180 on the second electrode 170, and color filters 190 on the encapsulation layer 180.

The substrate 110 may be a silicon wafer substrate formed using a semiconductor process. The substrate 110 may include a semiconductor material, e.g., a group IV semiconductor, a group III-V compound semiconductor, or a group II-VI compound semiconductor. For example, the group IV semiconductor may include silicon, germanium, or silicon-germanium. The substrate 110 may be provided as a bulk wafer, an epitaxial layer, a silicon on insulator (SOI) layer, or a semiconductor on insulator (SeOI) layer. As used herein, the term "or" is not an exclusive term, e.g., "A or B" would include A, B, or A and B.

The organic light emitting device 100 according to an example embodiment may include driving transistors corresponding to a plurality of pixels, respectively, on the substrate 110 in which a display region having a plurality of pixels is defined. The driving transistors will be described below.

The plurality of pixels may be distinguished by the first electrodes 150 spaced apart from each other. For example, the configurations constituting the pixels may be three consecutively disposed first electrodes 150, the organic light emitting layer 160 on the first electrodes 150, and the second electrode 170 on the organic light emitting layer 160. The three consecutively disposed first electrodes 150 may correspond to the color filters 190, respectively. For example, respective ones of the first electrodes 150 may underlie a corresponding one of the color filters 190 (e.g., the respective ones of the first electrodes 150 may be between the corresponding one of the color filters 190 and the substrate 110 in a vertical Z direction). The respective first electrodes 150, the organic light emitting layer 160, and the second electrode 170 may be defined as subpixels. The pixel may include a plurality of the subpixels. For example, three consecutive subpixels in one direction may constitute one pixel.

The organic light emitting layer 160 may cover the insulating layer 140 and the first electrodes 150. The organic light emitting layer 160 may be a common layer disposed on the pixels in common.

The second electrode 170 may cover the organic light emitting layer 160. The second electrode 170 may be a common layer disposed on the pixels in common.

The encapsulation layer 180 may cover the second electrode 170. The encapsulation layer 180 may help prevent oxygen or moisture from penetrating into the organic light emitting layer 160 and the second electrode 170.

In an implementation, the first electrodes 150, the organic light emitting layer 160, and the second electrode 170 may constitute a light emitting part EP. In the light emitting part EP, holes injected from the first electrodes 150 and electrons injected from the second electrode 170 may be transported into the organic light emitting layer 160 to form an exciton, and when the exciton transitions from an excited state to a grounded state, light may be generated to be emitted in the form of visible light.

Figure 2A:
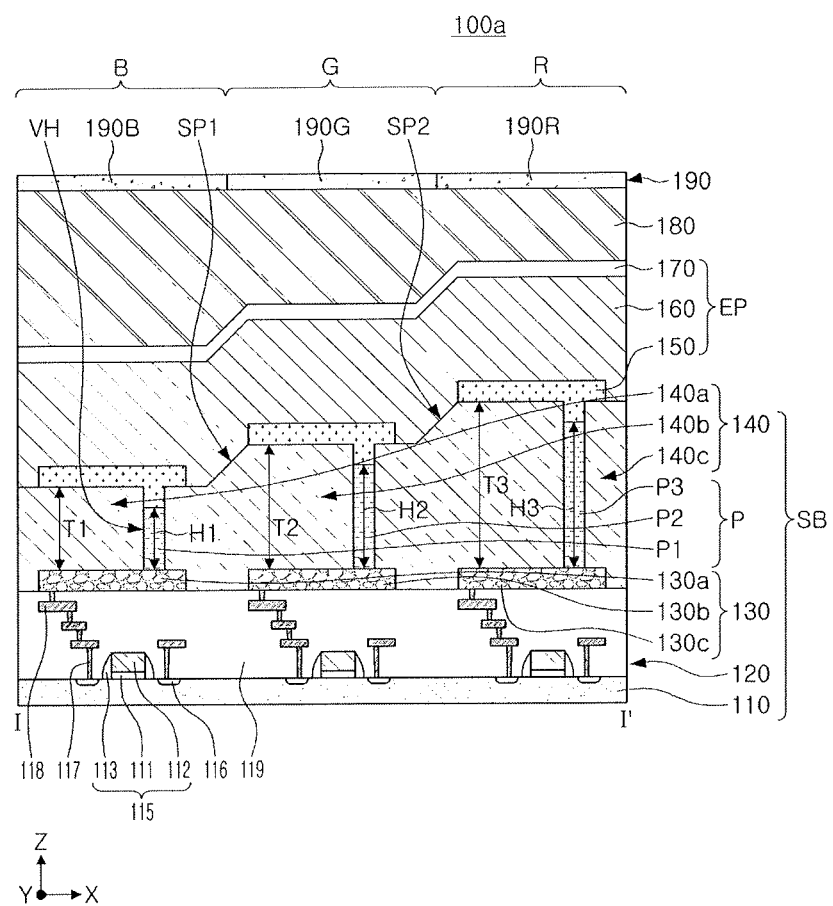
FIGS. 2A to 5 illustrate cross-sectional views of organic light emitting devices according to example embodiments.

FIG. 2A illustrates a cross-sectional view of an organic light emitting device according to example embodiments. FIG. 2A illustrates a region corresponding to a cross section of the organic light emitting device, taken along line I-I' of FIG. 1.

Referring to FIG. 2A, the circuit region 120 may be on the substrate 110. The circuit region 120 may include, e.g., circuit devices 115, a circuit region insulating layer 119, circuit contact plugs 117, and circuit wiring lines 118.

The circuit devices 115 may include driving transistors. Each of the circuit devices 115 may include a gate insulating layer 111, a gate electrode 112, and a gate spacer 113. Source/drain regions 116 may be on both sides of the gate electrode 112 in the substrate 110.

The gate insulating layer 111 may include, e.g., an oxide, nitride, or high-k material. The high-k material may refer to a dielectric material having a dielectric constant higher than that of silicon oxide ($SiO_2$). The high-k material may include, e.g., aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$), or praseodymium oxide ($Pr_2O_3$).

The gate electrode 112 may be on the gate insulating layer 111. The gate electrode 112 may include a conductive material, e.g., a metal nitride such as titanium nitride (TiN), tantalum nitride (TaN), or tungsten nitride (WN), and/or a metal such as aluminum (Al), tungsten (W), molybdenum (Mo) or the like, or a semiconductor material such as doped polysilicon. The gate electrode 112 may be comprised of two or more layers (e.g., a multilayer).

The gate spacer 113 may be on both side surfaces of the gate electrode 112, and may insulate the source/drain regions 116 from the gate electrode 112. In an implementation, the gate spacer 113 may have a multilayer structure. The gate spacer 113 may be formed of an oxide, a nitride, and an oxynitride, e.g., a low dielectric constant film.

The source/drain regions 116 may be a semiconductor layer including silicon (Si), and may include impurities of different types and/or concentrations.

The circuit region insulating layer 119 may be on the circuit device 115 on the substrate 110. The circuit contact plugs 117 may penetrate through the circuit region insulating layer 119 to be electrically connected to the source/drain regions 116. In an implementation, the circuit contact plugs 117 may also be connected to the gate electrode 112. The circuit wiring lines 118 may be electrically connected to the circuit contact plugs 117 and may be in a plurality of layers.

In an implementation, the circuit contact plugs 117 may have, e.g., an inclined side surface in which a lower width is narrower than an upper width depending on an aspect ratio. The circuit contact plugs 117 may recess to contact the source/drain regions 116, and may also contact along upper surfaces of the source/drain regions 116. The circuit contact plugs 117 may include, e.g., a metal nitride such as titanium nitride (TiN), tantalum nitride (TaN), or tungsten nitride (WN), or a metal material such as aluminum (Al), tungsten (W), or molybdenum (Mo).

In an implementation, the circuit region 120 may further include gate lines and data lines intersecting the gate lines. The gate lines may be connected to a gate driver to receive gate signals. The data lines may be connected to a data driver to receive data voltages.

Each of the driving transistors constituted by the circuit devices 115 may correspond to the subpixel, to be connected to the first electrodes 150, respectively. The driving transistors may respectively supply a predetermined voltage to the first electrodes 150 depending on the data voltage of the data line when a gate signal is input from the gate line.

In an implementation, reflective metal layers 130 may be spaced apart from each other on the circuit region 120 (e.g., in a horizontal X direction and/or in a horizontal Y direction). The reflective metal layers 130 may be spaced apart from each other, and may include, e.g., a first reflective metal layer 130a, a second reflective metal layer 130b, and a third reflective metal layer 130c, parallel to an upper surface of the substrate 110 (e.g., in the horizontal X direction and/or in the horizontal Y direction). The first to third reflective metal layers 130a, 130b and 130c may be at substantially the same height (e.g., the same distance in the vertical Z direction) from the upper surface of the substrate 110.

The first to third reflective metal layers 130a, 130b and 130c may be electrically connected to the driving transistors, respectively. In an implementation, the first to third reflective metal layers 130a, 130b and 130c may be electrically connected to the source/drain regions 116 through the circuit wiring lines 118, respectively.

The first to third reflective metal layers 130a, 130b and 130c may reflect light emitted from the light emitting part EP. The first to third reflective metal layers 130a, 130b and 130c may include a metal material having high reflectance. In an implementation, the first to third reflective metal layers 130a, 130b and 130c may include a material, e.g., aluminum (Al) or silver (Ag).

In an implementation, a buffer electrode may be on the reflective metal layers 130. The buffer electrode may include a double layer structure of titanium (Ti) and titanium nitride (TiN). The buffer electrode may help protect the reflective metal layers 130, increase adhesion between metals, and reduce contact resistance between metals.

In an implementation, the insulating layer 140 may cover upper and side surfaces of the reflective metal layers 130, and may cover a portion of an upper surface of the circuit region insulating layer 119, between the reflective metal layers 130.

The insulating layer 140 may include a first insulating region 140a covering an upper surface of the first reflective metal layer 130a and having a first thickness T1 (in the vertical Z direction), a second insulating region 140b covering an upper surface of the second reflective metal layer 130b and having a second thickness T2 (in the vertical Z direction) that is greater than the first thickness T1, and a third insulating region 140c covering an upper surface of the third reflective metal layer 130c having a third thickness T3 (in the vertical Z direction) that is greater than the second thickness T2. In an implementation, the first to third thicknesses T1, T2 and T3 may each have a value within a range of, e.g., about 50 nm to 900 nm. In an implementation, the first thickness T1 may be, e.g., about 70 nm to about 90 nm, the second thickness T2 may be, e.g., about 160 nm to about 200 nm, and the third thickness T3 may be, e.g., about 260 nm to about 300 nm.

The first to third thicknesses T1, T2 and T3 may variously vary depending on wavelengths of light to be emitted from the respective sub-pixels. For example, the insulating layer 140 may have first to third thicknesses T1, T2 and T3 in consideration of the distance of microcavity structures of respective subpixels. The microcavity structure refers to a structure in which the light emitted from the organic light emitting layer is reflected and re-reflected between metal patterns spaced in the vertical Z direction. Light emitted from the organic light emitting layer 160 undergoes reflection, total reflection, interference, diffraction, or scattering in the microcavity structure.

Light emitted from the organic light emitting layer 160 may be reflected by the reflective metal layers 130 and the second electrode 170, and light reflected between the reflective metal layers 130 and the second electrode 170 may interfere with each other. The insulating layer 140 may provide a microcavity structure in which a resonance phenomenon occurs in the case in which transmitted light or reflected light is amplified due to constructive interference with each other while the light repeats reflection and re-reflection.

When the insulating layer 140 has a resonance thickness to provide a microcavity structure in which the resonance phenomenon occurs, the intensity of light having a desired wavelength may be amplified and may be emitted externally by constructive interference of light. As a result, the luminance of light having a desired wavelength is increased, only the wavelength matching the condition is reinforced, and the wavelength that is not satisfied or not desired is canceled, such that the spectrum is narrowed, thereby improving color purity and improving luminous efficiency. For example, an organic light emitting device having low power consumption by driving at a relatively low current due to an increase in luminance.

In an implementation, a distance between the metal reflective layers 130 and the second electrode 170 (in the vertical Z direction) may be, e.g., $n\lambda/2$ (in which n is a natural number) with respect to a wavelength $\lambda$ of desired light.

The insulating layer 140 may have different first to third thicknesses T1, T2 and T3, and the insulating layer 140 may include a first stepped portion SP1 connecting the first and second insulating regions 140a and 140b (e.g., where the first thickness T1 changes to the second thickness T2), and a second stepped portion SP2 connecting the second and third insulating regions 140b and 140c (e.g., where the second thickness T2 changes to the third thickness T3). In an implementation, the first and second stepped portions SP1 and SP2 may have an inclined surface. The inclined surface may be between the first and second insulating regions 140a and 140b and between the second and third insulating regions 140b and 140c.

In an implementation, the inclined surface may form an angle of about 0° to about 90° with the substrate 110 (e.g., with a plane of the top surface of the substrate 110). For example, one end of an upper surface of the second insulating region 140b, adjacent to the first insulating region 140a, may be connected to an inclined surface that forms an angle of about 45° with the substrate 110, and the inclined surface may be connected to one end of an upper surface of the first insulating region 140a, adjacent to the second insulating region 140b.

The insulating layer 140 may be a region through which light emitted from the light emitting part EP is transmitted. The insulating layer 140 may include an insulating material, e.g., silicon oxide or silicon nitride, and may include a material having a relatively high transmittance.

The organic light emitting device, e.g., an organic light emitting device 100a may further include via plugs P. The via plugs P may penetrate through the insulating layer 140 to contact a portion of an upper portion of the reflective metal layers 130. In an implementation, the via plugs P may include a first via plug P1 penetrating through the first insulating region 140a to contact the first reflective metal layer 130a, a second via plug P2 penetrating through the second insulating region 140b to contact the second reflective metal layer 130b, and a third via plug P3 penetrating through the third insulating region 140c to contact the third reflective metal layer 130c.

An upper surface (e.g., a surface facing away from the substrate 110 in the vertical Z direction) of the first via plug P1 may be lower than (e.g., closer to the substrate 110 in the vertical Z direction than) an upper surface of the first insulating region 140a. An upper surface of the second via plug P2 may be lower than an upper surface of the second insulating region 140b. An upper surface of the third via plug P3 may be lower than an upper surface of the third insulating region 140c.

The first via plug P1 may have a first height H1 (in the vertical Z direction) that is less than the first thickness T1 of the first insulating region 140a, from the first reflective metal layer 130a, the second via plug P2 may have a second height H2 (in the vertical Z direction) that is less than the second thickness T2 of the second insulating region 140b, from the second reflective metal layer 130b, and the third via plug P3 may have a third height H3 (in the vertical Z direction) that is less than the third thickness T3 of the third insulating region 140c, from the third reflective metal layer 130c. In an implementation, the first height H1 of the first via plug P1 may be less than the second height H2 of the second via plug P2, and the second height H2 may be less than the third height H3 of the third via plug P3. In an implementation, the first to third heights H1, H2 and H3 may vary depending on an etching process to be described below.

A width of the via plugs P (e.g., in the horizontal X direction and/or in the horizontal Y direction) may have a value in the range of, e.g., about 0.1 µm to 1 µm. The first to third via plugs P1, P2 and P3 may be formed in the same process step to have substantially the same width. In an implementation, the widths of the via plugs P may variously change depending on an etching process to be described later.

In an implementation, the organic light emitting device 100a may include via holes VH penetrating through the insulating layer 140, and each of the via holes VH may include a first region of which the interior is filled with tungsten (W), and a second region on the first region and in contact with or open to the first electrodes 150. The second region may be formed of or filled with the same material as the first electrodes 150. The first and second regions may be in contact with (e.g., continuous with) each other in the insulating layer 140.

In an implementation, the via plugs P may include, e.g., a conductive material such as tungsten (W) or copper (Cu) used in a semiconductor process. In some devices, via plugs may be formed of indium tin oxide (ITO) in a process of manufacturing a display device. The organic light emitting device according to an example embodiment may be formed in a semiconductor process, and the via plugs may be formed of a metal material such as tungsten (W). As the size of the pixel of the organic light emitting device decreases, the size of the via holes may also decrease. For example, by filling the narrowed via holes with tungsten (W), the occurrence of voids may be prevented, thereby providing an organic light emitting device having improved reliability.

The via plugs P may include the conductive material and may contact the reflective metal layers 130 to be electrically connected thereto, and may be electrically connected to the circuit devices 115 via the circuit wiring lines 118 contacting the reflective metal layers 130.

In an implementation, the substrate 110, the circuit region 120, the reflective metal layers 130, the insulating layer 140, and the via plugs P may be referred to as a substrate part SB. The substrate part SB may be below the light emitting part EP to apply a voltage to the light emitting part EP. Referring to FIG. 2A, the organic light emitting device 100a may include the substrate part SB and the light emitting part EP on the substrate part SB.

The first electrodes 150 may contact the via plugs P and may cover a portion of an upper surface of the insulating layer 140. The first electrodes 150 may extend downwardly (e.g., in the vertical Z direction) from an upper surface of the insulating layer 140 toward the reflective metal layers 130 to be electrically connected to the via plugs P. In an implementation, the first electrodes 150 may be at different heights (as measured from the reflective metal layers 130 in the vertical Z direction) to correspond to the first to third insulating regions 140a, 140b and 140c, respectively.

In an implementation, the first electrodes 150 may include a transparent conductive material capable of transmitting light. In an implementation, the first electrodes 150 may include, e.g., indium tin oxide (ITO), tin oxide (TO), indium zinc oxide (IZO) or indium tin zinc oxide (ITZO).

The organic light emitting layer 160 may cover upper and side surfaces of the first electrodes 150, and may cover a portion of an upper surface of the insulating layer 140 in a region in which the first electrodes 150 and the insulating layer 140 do not overlap. A portion of an upper surface of the organic light emitting layer 160 may have a curved, bent, or uneven surface due to different thicknesses of the insulating layer 140.

The organic light emitting layer 160 may be comprised of a single layer formed of a light emitting material, or may be comprised of a multilayer of a hole injection layer, a hole transporting layer, an emitting material layer, an electron transporting layer, and an electron injection layer.

The hole injection layer may help smoothly inject holes from the first electrodes 150 into the emitting material layer. The hole transporting layer may not only transport holes easily to the emitting material layer, and may also help increase luminous efficiency by suppressing movement of electrons generated from the second electrode 170 to the emitting material layer. The electron injection layer may help smoothly inject electrons. The electron transporting layer may help easily transport electrons to the emitting material layer. The emitting material layer may emit, e.g., white light. The emitting material layer may have a structure of a plurality of layers, e.g., in which a red light emitting layer, a green light emitting layer, and a blue light emitting layer are stacked.

In an implementation, the organic light emitting device 100a according to an example embodiment may include an organic light emitting layer in which at least one of the hole injection layer, the hole transporting layer, the emitting material layer, the electron transporting layer, and the electron injection layer is omitted except for the emitting material layer 160.

The second electrode 170 may cover an upper surface of the organic light emitting layer 160. The second electrode 170 may have a curved, bent, or uneven shape along (e.g., conformally) the upper surface of the organic light emitting layer 160.

The second electrode 170 may include, e.g., magnesium (Mg), calcium (Ca), aluminum (Al), silver (Ag), or alloys thereof, having a low work function, and may also include an auxiliary electrode or a bus electrode line formed of a transparent electrode material such as indium tin oxide (ITO), indium zinc oxide (IZO) or the like. In an implementation, the second electrode 170 may be formed of, e.g., an alloy of magnesium and silver (Mg:Ag), and may thus have semi-transmissive characteristics. Light emitted from the emitting material layer may be emitted externally through the second electrode 170. The second electrode 170 may have semi-transmissive properties, and a portion of light may be reflected by the second electrode 170 and may be directed toward the first electrodes 150 or the reflective metal layers 130.

The encapsulation layer 180 may cover an upper surface of the second electrode 170. A lower surface of the encapsulation layer 180 may have a curved, bent, or uneven shape along the upper surface of the second electrode 170. An upper surface of the encapsulation layer 180 may be parallel to the upper surface of the substrate 110 (e.g., may be flat).

The color filters 190 may cover the upper surface of the encapsulation layer 180. The color filters 190 may include a red color filter 190R, a green color filter 190G, and a blue color filter 190B. The red color filter 190R may selectively transmit red light among the light emitted from the organic light emitting layer 160. The green color filter 190G may selectively transmit green light among the light emitted from the organic light emitting layer 160. The blue color filter 190B may selectively transmit blue light among the light emitted from the organic light emitting layer 160.

In an implementation, the thickness of the insulating layer 140 may be formed differently, corresponding to each of the color filters 190.

The first reflective metal layer 130a, the first insulating region 140a, and the first electrode 150 and a portion of the organic light emitting layer 160 and a portion of the second electrode 170 on the first insulating region 140a, and the blue color filter 190B may overlap each other in the vertical Z direction (e.g., a direction perpendicular to the upper surface of the substrate 110), and may be defined as a blue sub-pixel B. The second reflective metal layer 130b, the second insulating region 140b, and the first electrode 150 and a portion of the organic light emitting layer 160 and a portion of the second electrode 170 on the second insulating region 140b, and the green color filter 190G may overlap each other in the vertical Z direction, and may be defined as a green subpixel G. The third reflective metal layer 130c, the third insulating region 140c, and the first electrode 150 and a portion of the organic light emitting layer 160 and a portion of the second electrode 170 on the third insulating region 140c, and the red color filter 190R may overlap each other in the vertical Z direction, and may be defined as a red subpixel R.

As described above, the first to third insulating regions 140a, 140b and 140c may have different thicknesses, and light satisfying the resonance wavelength condition may be enhanced by interference. Light intensity may be amplified in a specific direction by interference of light between the second electrodes 170 and the reflective metal layers 130. For example, the first to third thicknesses T1, T2 and T3 of the first to third insulating regions 140a, 140b and 140c may correspond to the corresponding red, green, and blue subpixels R, G and B. For example, the third thickness T3 of the third insulating region 140c corresponding to the red subpixel R may be thickest, the second thickness T2 of the second insulating region 140b corresponding to the green subpixel G may be less than the third thickness T3, and the first thickness T1 of the first insulating region 140a corresponding to the blue subpixel B may be less than the second thickness T2. The thickness of the insulating layer 140 may be increased in order of the regions underlying the red, green, and blue color filters 190R, 190G and 190B, e.g., to correspond to the red, green, and blue color filters 190R, 190G and 190B.

Figure 2B:
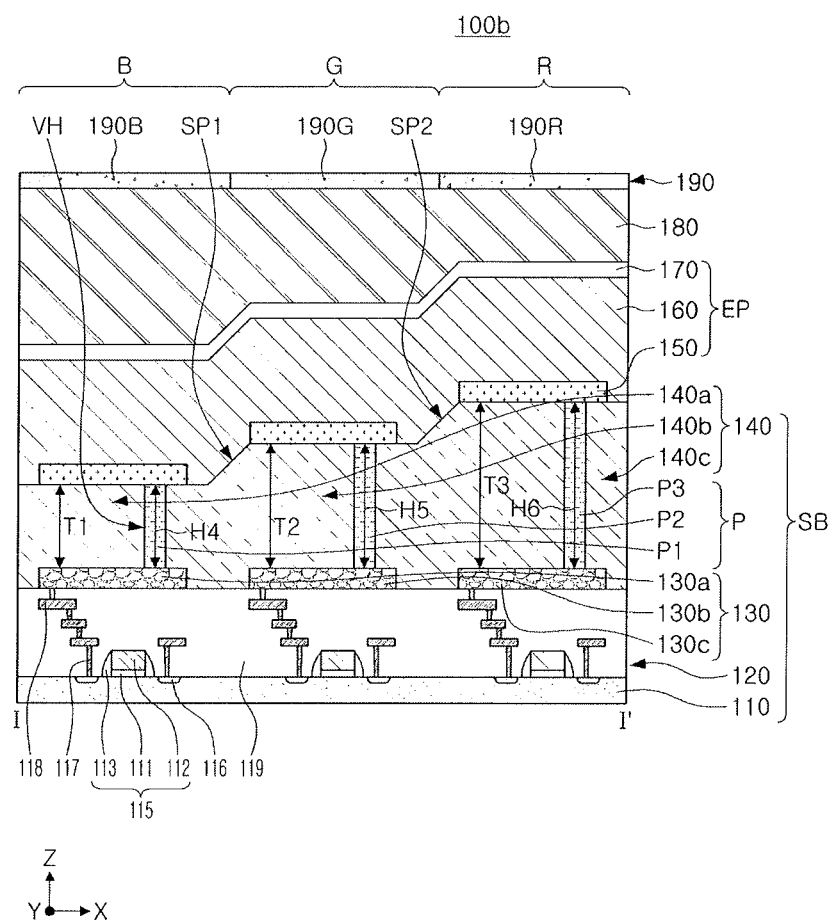

FIG. 2B illustrates a cross-sectional view of an organic light emitting device according to example embodiments.

In the case of an organic light emitting device 100b with reference to FIG. 2B, unlike the example embodiment of FIG. 2A, first to third heights H4, H5 and H6 of first to third via plugs P1, P2 and P3 (in the vertical Z direction) may be substantially the same as first to third thicknesses T1, T2 and T3 of first to third insulating regions 140a, 140b and 140c. For example, the first via plug P1 may have a first height H4 (as measured from the first reflective metal layer 130a in the vertical Z direction), and the first insulating region 140a may have a first thickness T1 (as measured from the first reflective metal layer 130a in the vertical Z direction). For example, the first height H4 and the first thickness T1 may be substantially the same. An upper surface of the first via plug P1 and an upper surface of the first insulating region 140a may be at the same height from the upper surface of the substrate 110 (e.g., may be coplanar). An upper surface of the second via plug P2 and an upper surface of the second insulating region 140b may be at the same height (in the vertical Z direction) from the upper surface of the substrate 110. An upper surface of the third via plug P3 and an upper surface of the third insulating region 140c may be at the same height (in the vertical Z direction) from the upper surface of the substrate 110. In an implementation, the first to third heights H4, H5 and H6 may be variously changed according to an etching process to be described below.

Unlike the example embodiment of FIG. 2A, in the organic light emitting device 100b, the first electrodes 150 may not extend downwardly (in the vertical Z direction) from an upper surface of an insulating layer 140 toward the reflective metal layers 130, and may be electrically connected to via plugs P, respectively. For example, the first electrodes 150 may not include a portion that extends downwardly (in the vertical Z direction) into an insulating layer 140.

Figure 3:
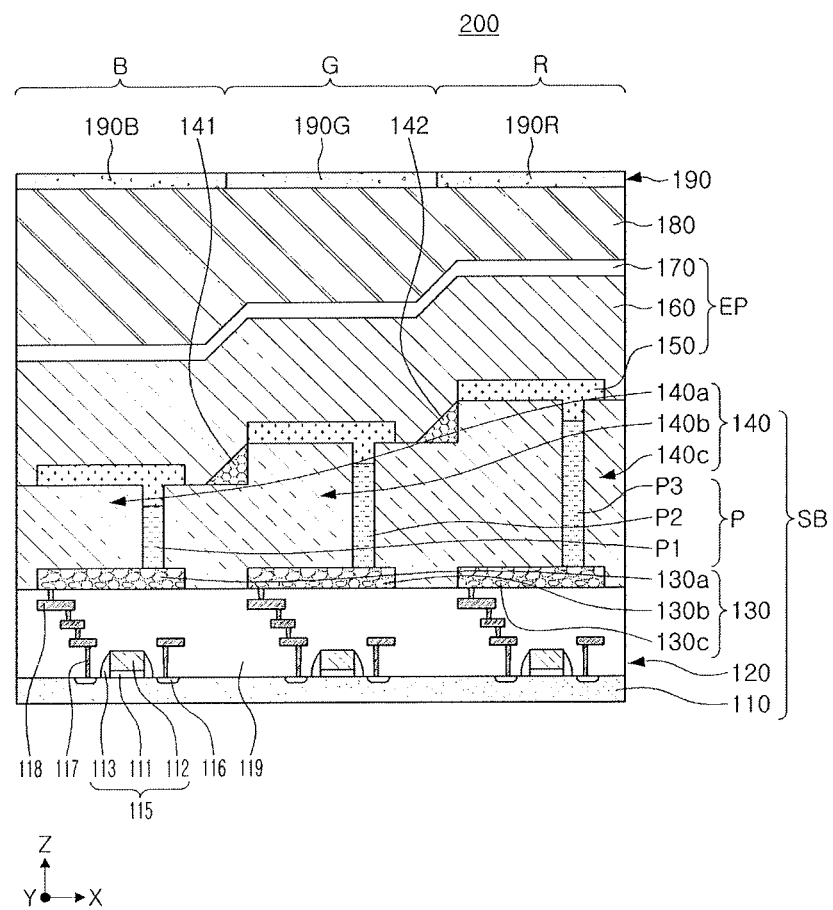

FIG. 3 illustrates a cross-sectional view of an organic light emitting device according to another example embodiment.

Referring to FIG. 3, an organic light emitting device 200 according to an example embodiment may further include a first spacer 141 and a second spacer 142 on the insulating layer 140. In an implementation, the first and second spacers 141 and 142 may be at different heights from one another (in the vertical Z direction relative to the upper surface of the substrate 110). The first spacer 141 may be in contact with an upper surface of the first insulating region 140a and a side surface of the second insulating region 140b and may provide an inclined surface between the first insulating region 140a and the second insulating region 140b. The second spacer 142 may be in contact with an upper surface of the second insulating region 140b and a side surface of the third insulating region 140c and may provide an inclined surface between the second insulating region 140b and the third insulating region 140c. In an implementation, the first and second spacers 141 and 142 may have a right triangle shape, as illustrated in FIG. 3. In an implementation, the first and second spacers 141 and 142 may be modified to have various shapes. In an implementation, the inclined surfaces of the first and second spacers 141 and 142 may have a convex shape to face externally.

Figure 4:
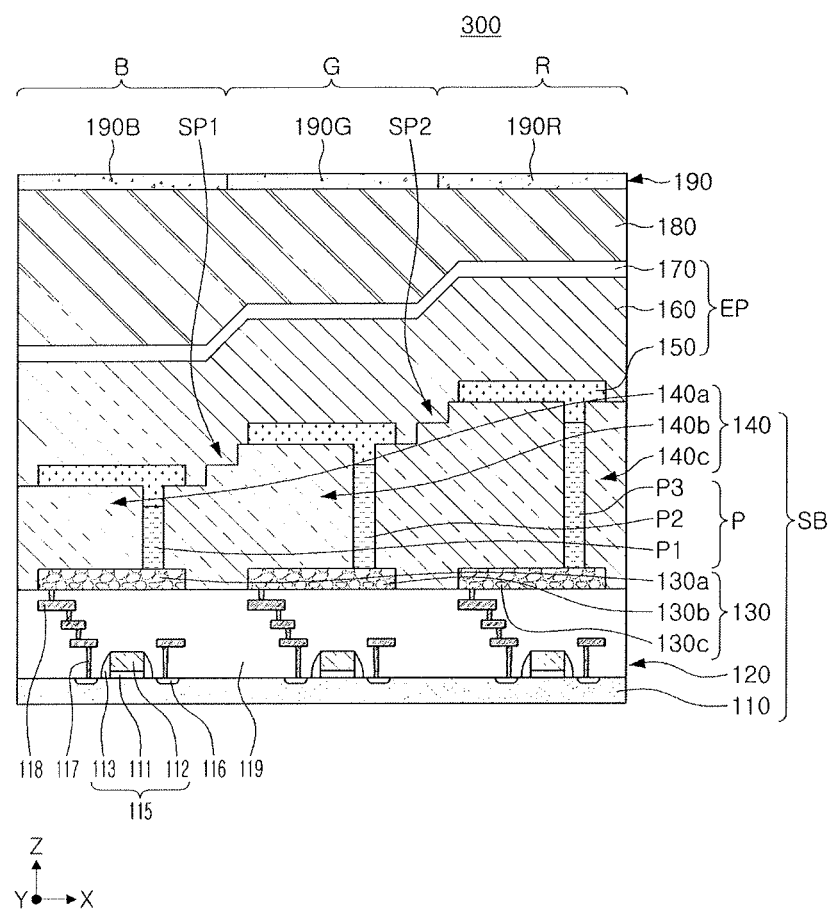
Figure 5:
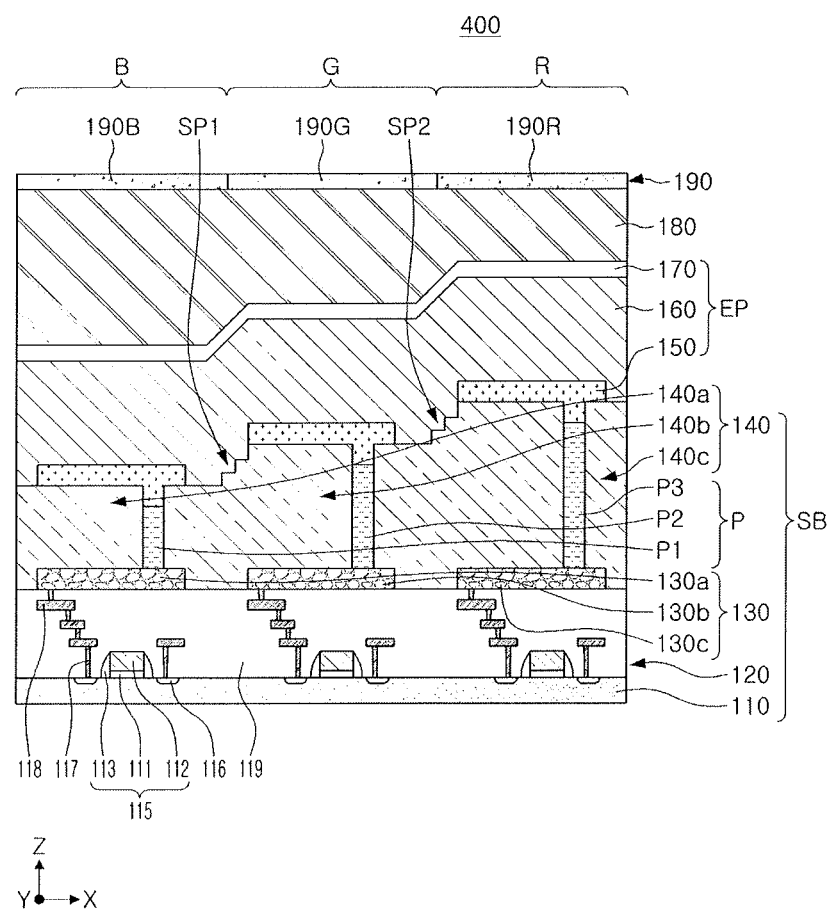

FIGS. 4 and 5 illustrate cross-sectional views of organic light emitting devices according to other embodiments, respectively.

FIGS. 4 and 5 will be described only with respect to modified parts, differently from those described above with reference to FIGS. 1 and 2A.

Referring to FIG. 4, an organic light emitting device 300 may include an insulating layer 140, and in the insulating layer 140, a first stepped portion SP1 connecting a first insulating region 140a and a second insulating region 140b and a second stepped portion SP2 connecting the second insulating area 140b and a third insulating area 140c may each include a plurality of bent portions (e.g., steps).

In an implementation, the plurality of bent portions may have a stepped shape. For example, the insulating layer 140 may have a stepped shape in such a manner that the thickness stepwise increases or decreases at a predetermined interval. In an implementation, as illustrated in FIG. 4, the plurality of bent portions may each have two bent portions (e.g., two steps), and an angle formed by the bent portions may be, e.g., approximately 90°. In an implementation, an angle formed by the bent portions may be greater than or less than 90° or may have a curved shape.

The first and second stepped portions SP1 and SP2 may each have two bent portions (e.g., two steps), thereby reducing an area in which a residue of tungsten (W) may be deposited due to a difference in thickness of the insulating layer 140.

Referring to FIG. 5, an organic light emitting device 400 may include an insulating layer 140, and the insulating layer 140 may include a first stepped portion SP1 and a second stepped portion SP2. The first and second stepped portions SP1 and SP2 may each have three bent portions (e.g., three steps). In an implementation, the three bent portions may have a stepped shape. For example, the insulating layer 140 may have a stepped shape in such a manner that the thickness stepwise increases or decreases at a predetermined interval. In an implementation, the three bent portions may have a curved shape.

The first and second stepped portions SP1 and SP2 may have three bent portions (e.g., three steps), thereby reducing the area in which the residue of tungsten (W) may be deposited due to the difference in thickness of the insulating layer 140.

Figure 6:
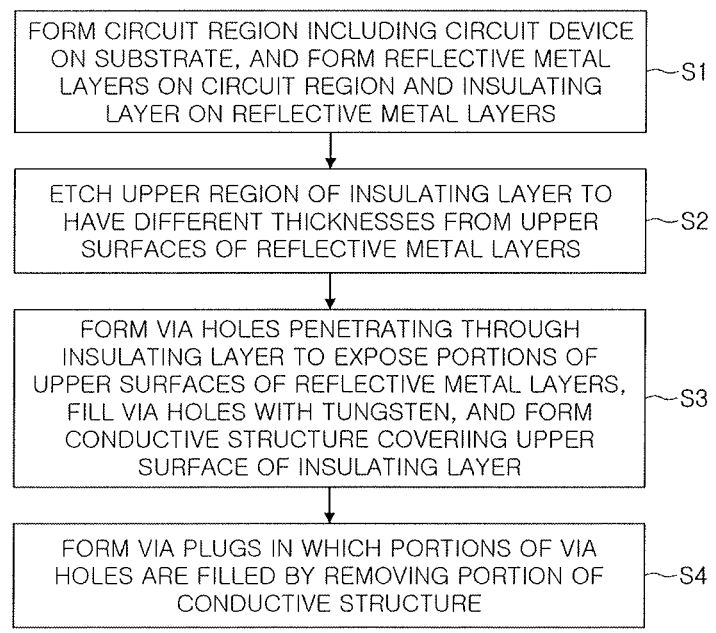
FIG. 6 illustrates a flowchart of a method of manufacturing an organic light emitting device according to example embodiments.

Next, a method of manufacturing an organic light emitting device according to an example embodiment will be described with reference to FIGS. 6 to 10. FIG. 6 illustrates a flowchart of a method of manufacturing an organic light emitting device according to example embodiments, and FIGS. 7 to 10 illustrate stages in a method of manufacturing an organic light emitting device according to example embodiments.

Figure 7:
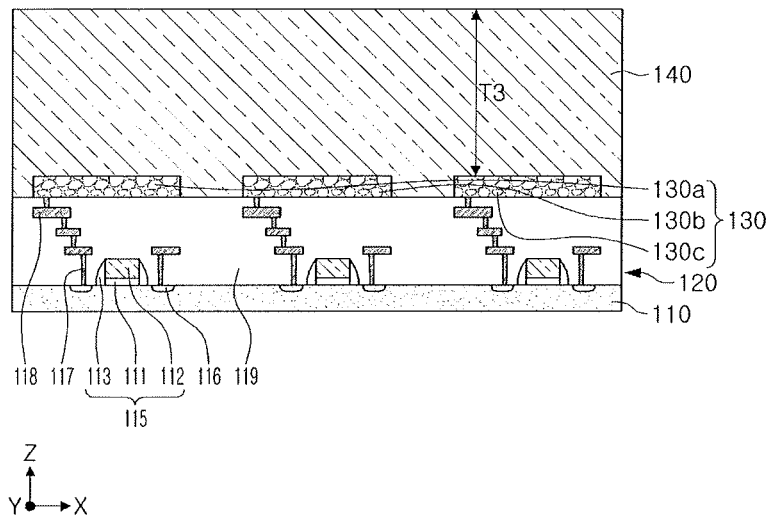
FIGS. 7 to 10 illustrate stages in a method of manufacturing an organic light emitting device according to example embodiments.

Referring to FIGS. 6 and 7, a substrate 110 may be prepared, a circuit region 120 including a circuit device 115 may be formed on the substrate 110, reflective metal layers 130 may be spaced apart from each other on the circuit region 120, and an insulating layer 160 may be formed on the reflective metal layers 130, in S1.

First, the circuit region 120 including the substrate 110, the circuit devices 115, circuit contact plugs 117, circuit wiring lines 118 and a circuit region insulating layer 119 may be formed. The circuit devices 115 may include a gate insulating layer 111, a gate electrode 112, and a gate spacer 113. Source/drain regions 116 in the substrate 110 may be formed on both sides of the gate electrode 112.

Next, a conductive material layer may be formed on the circuit region 120, and the conductive material layer may be etched using a mask to form the reflective metal layers 130 spaced apart from each other. The reflective metal layers 130 spaced apart from each other may include a first reflective metal layer 130a, a second reflective metal layer 130b, and a third reflective metal layer 130c, to correspond to the circuit devices 115, respectively.

Next, an insulating layer 140 may be formed to cover upper and side surfaces of the reflective metal layers 130 and a portion of an upper surface of the circuit region insulating layer 119 to have a predetermined thickness (e.g., as measured in the vertical Z direction). The insulating layer 140 may be formed using atomic layer deposition (ALD) or chemical vapor deposition (CVD).

Figure 8:
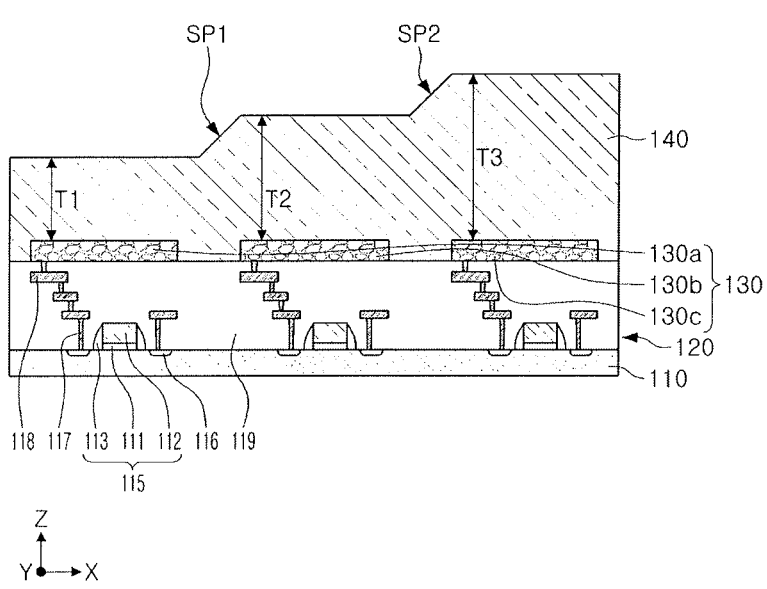

Referring to FIGS. 6 and 8, the upper region of the insulating layer 140 may be etched to have thicknesses (as measured in the vertical Z direction from the upper surfaces of the reflective metal layers 130) that are different from each other, in S2.

By etching using a plurality of masks, the insulating layer 140 may be formed to have the different thicknesses (as measured in the vertical Z direction from the upper surfaces of the reflective metal layers 130), thereby providing stepped portions SP1 and SP2. For example, a first mask layer may be formed to expose a portion of an upper surface of the insulating layer 140, and a first stepped portion may be formed through a dry etching process. Next, a second mask layer may be formed to cover a portion of the insulating layer 140 removed by the dry etching process and a portion of the insulating layer 140 not removed thereby, and a second stepped portion may be formed through the dry etching process. An inclined surface may be formed on the stepped portion of the insulating layer 140 during the dry etching process. For example, one side of each of the first mask layer and the second mask layer may have an inclined surface such that the stepped portions SP1 and SP2 of the insulating layer 140 may have an inclined surface during a dry etching process. The inclined surface may help prevent tungsten (W) filling a via plug P from being deposited in a region in which the stepped portions SP1 and SP2 of the insulating layer 140 are formed in a subsequent process.

In an implementation, a spacer may be respectively formed in regions in which the stepped portions SP1 and SP2 are formed in the insulating layer 140. The spacer may include an insulating material, such as silicon nitride, and may include, e.g., SiN. In an implementation, a plurality of bent portions having a stepped shape may be formed in regions in which the stepped portions SP1 and SP2 are formed in the insulating layer 140. The spacer and the plurality of bent portions may help prevent deposition of tungsten (W) filling the via plug P in the regions in which the stepped portions SP1 and SP2 of the insulating layer 140 are formed, in a subsequent process.

Figure 9:
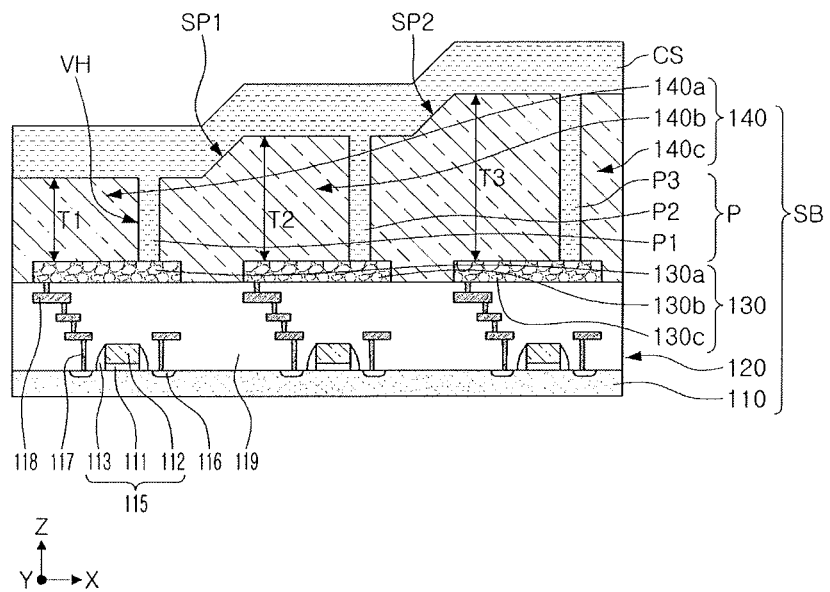

Referring to FIGS. 6 and 9, a plurality of via holes VH may be formed to penetrate through the insulating layer 140, the plurality of via holes VH may be filled with a conductive material such as tungsten (W) or copper (Cu), and a conductive structure CS may be formed to cover an upper surface of the insulating layer 140, in S3.

First, the insulating layer 140 may be anisotropically etched using a mask layer to form the plurality of via holes VH exposing portions of the upper surfaces of the reflective metal layers 130. In an implementation, widths of the plurality of via holes VH may be more narrowed in a downward direction according to an aspect ratio of the plurality of via holes VH. The plurality of via holes VH may be formed to correspond to the reflective metal layers 130, respectively. For example, one via hole VH may be formed to correspond to each of the first to third reflective metal layers 130a, 130b and 130c. The plurality of via holes VH may be formed to have different heights to correspond to different thicknesses of the insulating layer 140.

Next, the plurality of via holes VH may be filled, and the conductive structure CS may be formed to cover the upper surface of the insulating layer 140. The conductive structure CS may cover the upper surface of the insulating layer 140 and may cover the plurality of stepped portions SP1 and SP2 of the insulating layer 140. In an implementation, the conductive structure CS may cover the inclined surfaces formed on the stepped portions SP1 and SP2. In an implementation, the conductive structure CS may cover the spacer or the plurality of bent portions formed on the stepped portions SP1 and SP2. The conductive structure CS may have substantially the same thickness on the insulating layer 140, and the upper surface of the conductive structure CS may have different heights due to the different thicknesses of the insulating layer 140. The conductive structure CS may be formed using atomic layer deposition (ALD) or chemical vapor deposition (CVD). In an implementation, prior to forming the conductive structure CS, an adhesive layer may be further formed to cover inner side surfaces of the via holes VH and portions of exposed upper surfaces of the reflective metal layers 130.

Figure 10:
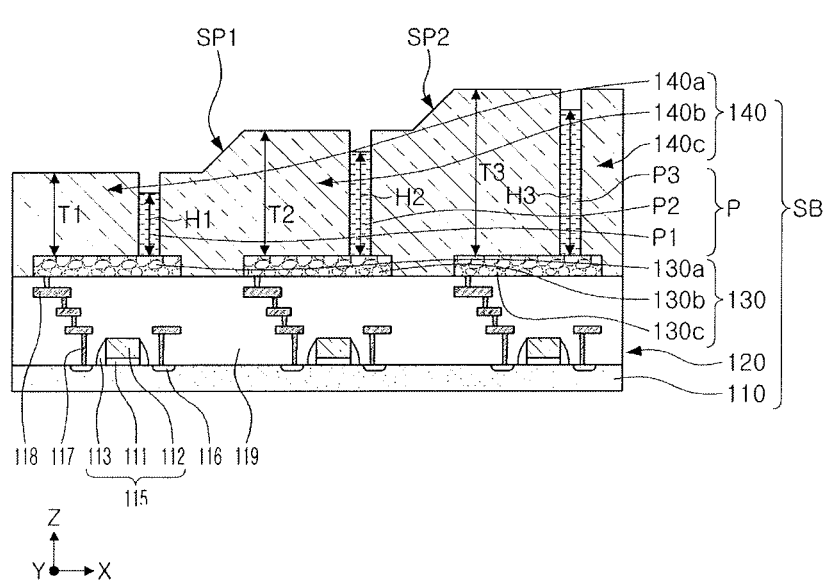

Referring to FIGS. 6 and 10, a portion of the conductive structure CS may be removed to form via plugs P in which portions of the via holes VH are filled, in S4.

By performing an etchback process, a region of the conductive structure CS, covering the upper surface of the insulating layer 140, and upper regions of interiors of the via holes (VH), adjacent to the upper surface of the insulating layer 140, may be removed. For example, upper surfaces of the via plugs P may be lower than an upper surface of the corresponding insulating layer 140 by a predetermined depth (e.g., the via plugs P may be recessed in the via holes VH). For example, a first via plug P1 penetrating through the first insulating region 140a having a first thickness T1 may have a first height H1 from the first reflective metal layer 130a. An upper surface of the first via plug P1 may be lower than or recessed in the upper surface of the first insulating region 140a, by a difference between the first thickness T1 and the first height H1.

In an implementation, the height of the via plugs P may be substantially the same as the thickness of the insulating layer 140 corresponding thereto. Upper surfaces of the via plugs P may be formed to be substantially coplanar with the upper surface of the insulating layer 140 corresponding thereto. The heights of the via plugs P may be changed in various embodiments, depending on etchback process conditions. For example, referring to FIG. 2B, an etchback process may be performed such that the first via plug P1 has the first height H4 that is substantially the same as the first thickness T1 of the first insulating region 140a.

As a result, as illustrated in FIG. 10, a substrate part SB including the substrate 110, the circuit region 120, the reflective metal layers 130, the via plugs P and the insulating layer 140 may be formed.

In the removing of the conductive structure CS, the insulating layer 140 may have the stepped portions SP1 and SP2, and residues of a conductive material such as tungsten (W), forming the conductive structure CS, could be deposited in a region in which the stepped portions SP1 and SP2 are present.

In the organic light emitting device according to the example embodiments, the insulating layer 140 may include an inclined surface in a region in which the stepped portions SP1 and SP2 are provided, may include a spacer providing an inclined surface, or may include a plurality of bent portions having a stepped shape. In an implementation, the conductive material, e.g., residues of tungsten (W), may be prevented from being deposited in regions in which the stepped portions SP1 and SP2 are present. As a result, an organic light emitting device having improved optical characteristics and luminous efficiency may be provided.

By way of summation and review, Organic Light Emitting Diode on Silicon (OLEDoS) have been considered in an effort to help improve optical characteristics such as resolution, luminous efficiency, and luminance of a microdisplay. OLEDoS may be provided by the technology of a display formed using a semiconductor process of a wafer substrate. The OLED may be on a Complementary Metal Oxide Semiconductor (CMOS).

As set forth above, by controlling the thickness of an insulating layer, an organic light emitting device having improved color purity and luminous efficiency in a microcavity structure may be provided.

Via plugs penetrating through an insulating layer include tungsten (W) may be used in a semiconductor process, and an organic light emitting device including pixels having improved integration may be provided.

A method of manufacturing an organic light emitting device, in which residues of tungsten (W) that may be deposited due to a difference in thickness of the insulating layer may be removed through the structure of the insulating layer, may be provided.

One or more embodiments may provide an organic light emitting device having improved optical characteristics.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic light emitting device, comprising:
a substrate;
a circuit region on the substrate, the circuit region including a circuit device;
reflective metal layers on the circuit region, the reflective metal layers including a first reflective metal layer, a second reflective metal layer and a third reflective metal layer spaced apart from each other in a horizontal direction;
an insulating layer including a first insulating region, a second insulating region, and a third insulating region, the first insulating region covering an upper surface of the first reflective metal layer and having a first thickness in a vertical direction orthogonal to the horizontal direction, the second insulating region covering an upper surface of the second reflective metal layer and having a second thickness in the vertical direction that is greater than the first thickness, and the third insulating region covering an upper surface of the third reflective metal layer and having a third thickness in the vertical direction that is greater than the second thickness;
via plugs including a first via plug, a second via plug, and a third via plug, the first via plug penetrating through the first insulating region to contact the first reflective metal layer, the second via plug penetrating through the second insulating region to contact the second reflective metal layer, and the third via plug penetrating through the third insulating region to contact the third reflective metal layer;
first electrodes in contact with the via plugs, respectively, and covering a portion of an upper surface of the insulating layer;
an organic light emitting layer on the first electrodes; and a second electrode on the organic light emitting layer,
wherein the first via plug, the second via plug, and the third via plug each include tungsten, and
wherein:
a distance from an upper surface of the first via plug to the substrate in the vertical direction is less than a distance from an upper surface of the first insulating region to the substrate in the vertical direction,
a distance from an upper surface of the second via plug to the substrate in the vertical direction is less than a distance from an upper surface of the second insulating region to the substrate in the vertical direction, and
a distance from an upper surface of the third via plug to the substrate in the vertical direction is less than a distance from an upper surface of the third insulating region to the substrate in the vertical direction.

2. The organic light emitting device as claimed in claim 1, wherein:
the first via plug has a first height in the vertical direction from the first reflective metal layer, the first height being less than the first thickness,
the second via plug has a second height in the vertical direction from the second reflective metal layer, the second height being less than the second thickness, and
the third via plug has a third height in the vertical direction from the third reflective metal layer, the third height being less than the third thickness.

3. The organic light emitting device as claimed in claim 1, wherein the first electrodes extend downwardly in the vertical direction from the upper surface of the insulating layer toward the reflective metal layers and are electrically connected to the via plugs.

4. The organic light emitting device as claimed in claim 1, wherein the insulating layer has inclined surfaces between the first insulating region and the second insulating region and between the second insulating region and the third insulating region.

5. The organic light emitting device as claimed in claim 4, further comprising:
a first spacer in contact with an upper surface of the first insulating region and a side surface of the second insulating region, the first spacer providing the inclined surface between the first insulating region and the second insulating region; and
a second spacer in contact with an upper surface of the second insulating region and a side surface of the third insulating region, the second spacer providing the inclined surface between the second insulating region and the third insulating region.

6. The organic light emitting device as claimed in claim 1, wherein the insulating layer includes:
a first stepped portion connecting the first insulating region and the second insulating region, and
a second stepped portion connecting the second insulating region and the third insulating region.

7. The organic light emitting device as claimed in claim 6, wherein each of the first stepped portion and the second stepped portion includes a plurality of bent portions.

8. The organic light emitting device as claimed in claim 1, wherein each of the first electrodes are at different heights in the vertical direction relative to the reflective metal layers.

9. The organic light emitting device as claimed in claim 1, further comprising:
an encapsulation layer on the second electrode; and
a red color filter, a green color filter, and a blue color filter on the encapsulation layer.

10. The organic light emitting device as claimed in claim 1, wherein:
the circuit region further includes source/drain regions, circuit contact plugs electrically connected to the source/drain regions, and circuit wiring lines, and
the first reflective metal layer, the second reflective metal layer, and the third reflective metal layer are respectively electrically connected to the circuit contact plugs.

11. An organic light emitting device, comprising:
a substrate part including a substrate, a circuit region including circuit devices on the substrate, reflective metal layers on the circuit region, an insulating layer covering side and upper surfaces of the reflective metal layers, and via plugs penetrating through the insulating layer; and
a light emitting part including first electrodes covering the insulating layer and in contact with the via plugs, an organic light emitting layer on the first electrodes, and a second electrode on the organic light emitting layer,
wherein:
the insulating layer includes portions having different thicknesses from each other, the thicknesses being in a vertical direction, and
the via plugs include:
a first region contacting the reflective metal layers and including tungsten, and
a second region on the first region.

12. The organic light emitting device as claimed in claim 11, further comprising:
an encapsulation layer on the second electrode; and
a red color filter, a green color filter, and a blue color filter on the encapsulation layer,
wherein:
a thickness in the vertical direction of a portion of the insulating layer underlying the green color filter is greater than a thickness in the vertical direction of a portion of the insulating layer underlying the blue color filter, and
a thickness in the vertical direction of a portion of the insulating layer underlying the red color filter is greater than the thickness in the vertical direction of a portion of the insulating layer underlying the green color filter.

13. The organic light emitting device as claimed in claim 11, wherein the second region of the via plugs is formed of the same material as a material of each of the first electrodes.

14. The organic light emitting device as claimed in claim 11, wherein the insulating layer has an inclined surface at a portion thereof where the thickness changes.

15. The organic light emitting device as claimed in claim 14, wherein the substrate part further includes a spacer providing the inclined surface at the portion thereof where the thickness changes.

16. The organic light emitting device as claimed in claim 11, wherein the insulating layer has a stepped shape at a portion thereof where the thickness changes.

17. An organic light emitting device, comprising:
a substrate;
a first reflective metal layer, a second reflective metal layer and a third reflective metal layer, spaced apart from each other on the substrate in a horizontal direction;
an insulating layer including a first insulating region, a second insulating region, and a third insulating region, the first insulating region covering an upper surface of the first reflective metal layer and having a first thickness in a vertical direction orthogonal to the horizontal direction, the second insulating region covering an upper surface of the second reflective metal layer and having a second thickness in the vertical direction that is greater than the first thickness, and the third insulating region covering an upper surface of the third reflective metal layer and having a third thickness in the vertical direction that is greater than the second thickness; and a first via plug penetrating through the first insulating region and contacting the first reflective metal layer, a second via plug penetrating through the second insulating region and contacting the second reflective metal layer, and a third via plug penetrating through the third insulating region and contacting the third reflective metal layer, wherein the first via plug has a first height in the vertical direction from the first reflective metal layer that is less than the first thickness, the second via plug has a second height in the vertical direction from the second reflective metal layer that is less than the second thickness, and the third via plug has a third height in the vertical direction from the third reflective metal layer that is less than the third thickness.

18. The organic light emitting device as claimed in claim 17, wherein:

the insulating layer has an inclined surface between the first insulating region and the second insulating region and between the second insulating region and the third insulating region, and the first via plug, the second via plug, and the third via plug each include tungsten.

* * * * *